US005523921A

United States Patent [19]
Van Lydegraf

[11] Patent Number: 5,523,921
[45] Date of Patent: Jun. 4, 1996

[54] PRINTED CIRCUIT ASSEMBLY HAVING IMPROVED REFERENCE PLANE ISOLATION

[75] Inventor: Curt Van Lydegraf, Boise, Id.

[73] Assignee: Hewlett-Packard Company, Palo Alto, Calif.

[21] Appl. No.: 370,770

[22] Filed: Dec. 22, 1994

[51] Int. Cl.$^6$ ....................................... H05K 9/00
[52] U.S. Cl. .......................... 361/818; 361/796; 361/800; 361/792; 361/816; 174/35 R; 257/659
[58] Field of Search ..................... 361/752, 760, 361/762, 796, 792, 800, 816, 818, 802, 807, 809; 174/35 R; 257/659, 660; 333/246, 247

[56] References Cited

U.S. PATENT DOCUMENTS

| | | | |
|---|---|---|---|
| 4,954,929 | 9/1990 | Baran | 361/414 |
| 5,119,047 | 6/1992 | Brown et al. | 333/12 |
| 5,165,055 | 11/1992 | Metsler | 333/12 |

Primary Examiner—Leo P. Picard
Assistant Examiner—Y. Whang

[57] ABSTRACT

A printed circuit assembly (PCA) having improved reference plane isolation for reducing electromagnetic and communication Input/Output (I/O) emissions includes a reference plane layer having a plurality of apertures patterned therein. A component layer of the PCA I/O communication circuitry and non I/O circuitry thereon. In the preferred embodiment, the apertures are aligned in a double row of substantially single file patterns on the reference plane. The single file patterns are positioned substantially parallel to and adjacent each other. Also, each aperture in each single file pattern is offset staggered with respect to a corresponding aperture in the adjacent single file pattern. When the reference plane layer and component layer are disposed in the PCA, the patterned apertures are placed relative to the component layer in a manner such that they substantially separate the non I/O circuitry from the I/O communication circuitry for reducing I/O communication emissions. In an alternate embodiment, the apertures are aligned in an individual, substantially single file pattern on the reference plane.

20 Claims, 4 Drawing Sheets

5,523,921

PRINTED CIRCUIT ASSEMBLY HAVING IMPROVED REFERENCE PLANE ISOLATION

FIELD OF THE INVENTION

This invention relates to a printed circuit assembly (PCA) and, more specifically, to a reference plane layer in a PCA having improved Input/Output (I/O) isolation for reducing common mode cable emissions.

BACKGROUND OF THE INVENTION

In computer systems and other electrical equipment, it is required that certain components maintain electromagnetic emissions below applicable class standards set by the appropriate regulatory agency, such as the United States Federal Communication Commission (FCC). For instance, for FCC class B devices presently, the emission limits run from about 40 dB μv/m at 30 MHz to about 50 dB μv/m at 1000 MHz.

In computer systems and related printed circuit assemblies (PCAs), digital integrated circuits (ICs) radiate switching noise which can cause emission problems beyond the FCC limits. Similarly, common mode potential (CMP) in a PCA can cause emission problems beyond the limits. In a PCA, common mode potential is caused by power plane voltage in relation to a ground plane, and their respective current flow. Either the power plane or the ground plane may be considered a reference plane and, in this context, is a solid sheet of conducting material. For reference purposes, common mode potential or common mode interference can be described as:

(1) Interference that appears between both signal leads and a common reference plane (ground) and causes the potential of both sides of the transmission path to be changed simultaneously and by the same amount relative to the common reference plane (ground).

(2) A form of interference that appears between any measuring circuit terminal and ground.

A PCA uses Input/Output (I/O) communications circuitry in conjunction with cabling connections for interconnecting separate circuitry, components, or devices. A common standard for I/O communications is small computer systems interface (SCSI). In reference to cabling connections of a PCA, it is not uncommon for a connected cable to act as a broadcast antenna whereby IC switching noise and CMP emissions are undesirably transmitted. As such, FCC emission limits may be exceeded. In contrast, when the cabling is not connected, the resulting PCA emissions may or may not exceed the FCC limits.

With regard to the PCA reference plane, isolation between the I/O cabling connections and the rest of the digital integrated circuitry connections reduces the undesirable signal frequency emissions through the cabling. A problem, however, resides in the fact that the reference plane is typically a solid sheet of conducting material in the PCA and does not lend itself to allowing for isolation of the circuitry as stated. Although a non conductive void can be formed in a reference plane by literally removing portions of the plane to isolate the applicable circuitry connections, such voids, in and of themselves, create a slot antenna effect and tend to increase undesirable emissions, i.e., in the form of differential loop emissions, rather than decrease such emissions.

Accordingly, objects of the present invention are to improve reference plane isolation in a PCA to reduce unacceptable common mode cable emissions without significantly increasing differential mode emissions.

SUMMARY OF THE INVENTION

According to principles of the present invention in its preferred embodiment, a printed circuit assembly (PCA) includes a reference plane layer having a plurality of apertures patterned therein to improve reference plane isolation for reducing electromagnetic emissions and, more specifically, common mode cable emissions. A component layer of the PCA includes general PCA functional circuitry (i.e., non Input/Output (I/O) circuitry), such as digital integrated circuitry, and I/O communication circuitry thereon.

In the preferred embodiment, the apertures are aligned in a double row of substantially single file patterns on the reference plane. The single file patterns are positioned substantially parallel to and adjacent each other. Also, each aperture in each single file pattern is staggered with respect to a corresponding aperture in the adjacent single file pattern.

When the reference plane layer and component layer are disposed in the PCA, the patterned apertures are placed relative to the component layer in a manner such that they are substantially perpendicular to signal traces and substantially separate the non I/O circuitry from the I/O communication circuitry for reducing electromagnetic emissions and, more specifically, I/O communication emissions.

According to further principles of the present invention in an alternate embodiment, the apertures are aligned in an individual, substantially single file pattern on the reference plane.

With the PCA of the present invention having improved reference plane isolation, common mode cable I/O emissions are reduced. Other objects, advantages, and capabilities of the present invention will become more apparent as the description proceeds.

DETAILED DESCRIPTION OF THE INVENTION

Figure 1:
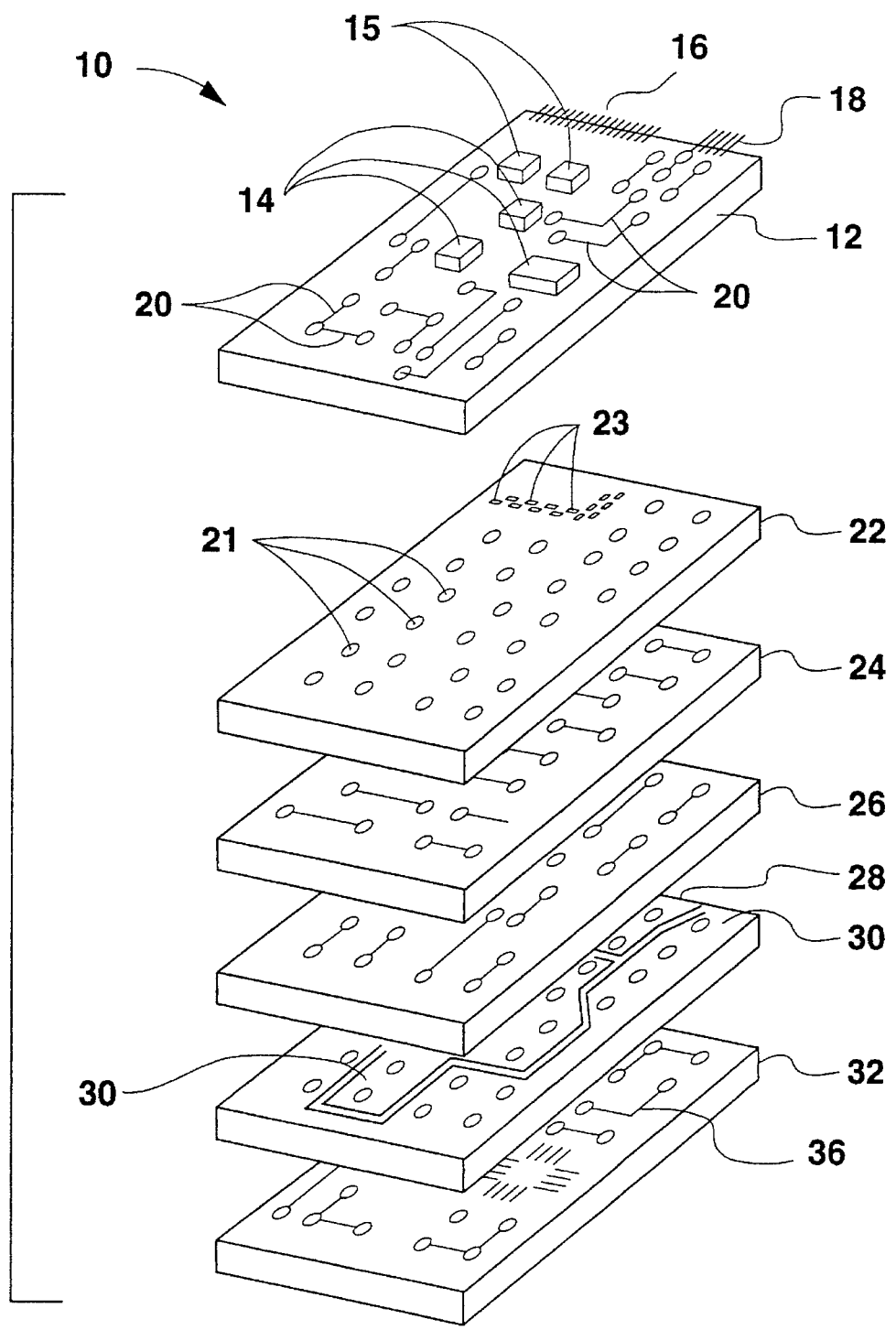
FIG. 1 is an exploded perspective view of a PCA having multiple layers and including a reference plane layer of the present invention.

FIG. 1 is an exploded perspective view of PCA 10 having multiple layers (planes) and including a reference plane layer 22 of the present invention. In final assembly, all layers are in contact and electrical trace connections are made. Although six layers are shown in this drawing, it is understood by those of ordinary skill in the art that these six layers are merely representative of this particular PCA. PCA's in general may include any number and variation of layers for embodying the present invention isolated reference plane.

Top layer 12 is a signal trace and component layer, including digital integrated circuits 14, I/O communication circuitry 15, multiple I/O cable connectors 16, power connectors 18, and multiple signal traces (conductors) 20. In this embodiment, I/O communication circuitry 15 and cable connectors 16 comply with the small computer systems interface (SCSI) standard. Although in this depiction signal traces are included on top layer 12, it is understood that this is only a depicted embodiment and that signal traces in general may not necessarily be on the same layer as the components but may be routed through vias to other layers of the PCA, depending on design criteria or preference. It is also understood that digital ICs 14 are merely representative of the general PCA functional circuitry (i.e., non Input/Output (I/O) circuitry), and that other circuitry could likewise be used, such as analog or discrete circuitry.

The second layer 22 is a ground plane, and in this embodiment, the reference plane. The ground plane is, typically, a thin, solid conducting copper sheet. A plurality of apertures 23 are patterned in reference plane 22 to improve I/O reference plane isolation for reducing electromagnetic and common mode cable emissions when a cable is connected to cable connectors 16 of top layer 12.

In this preferred embodiment, the apertures are slot shaped, and are aligned in a double row of substantially single file patterns on the reference plane. Each single file pattern is positioned substantially parallel to and adjacent the other. Also, each aperture in each single file pattern is staggered (offset) with respect to a corresponding aperture in the adjacent single file pattern.

The single file patterns of apertures 23 are placed on reference plane 22 such that, relative to top signal trace layer 12 in the PCA, they are substantially perpendicular to signal traces 20 (or at least more perpendicular than not in the preferred embodiment). Furthermore, with respect to component layer 12, the apertures substantially separate digital integrated circuitry (non I/O circuitry) 14 from I/O communication circuitry 15 for reducing I/O communication emissions that occur when a cable is connected (not shown) to cable connectors 16.

In this depiction, the double row of single file apertures 23 are on ground plane 22, and such is considered the reference plane. However, the apertures may similarly be placed on power plane 28. Namely, either ground plane 22 or power plane 28 may be the reference plane, depending on design criteria. However, regardless of which plane is designated the reference plane, apertures 23 are defined and placed such that a division of the substantially solid, conducting reference plane occurs creating an isolation effect between integrated circuitry 14 and I/O circuitry 15. Apertures 23 are also defined and placed such that differential loop emissions are minimized (the differential loop emissions being caused by return current flow around the apertures).

Consequently, digital switching noise and common mode interference is reduced. The definition and placement of the apertures (1) increases the impedance between the aperture divided portions of the reference plane, and (2) increases the mutual inductance between signal traces 20 of top layer 12 and reference (ground) plane 22. By increasing the impedance, reference plane isolation is improved, and by increasing the mutual inductance the differential current loops in the ground plane (or power plane) are reduced.

As common in the art, reference plane 22 also includes multiple holes 21 for connections between top layer 12 and third signal trace layer 24. Similar to third layer 24, fourth layer 26 is also a signal trace layer.

Although in this embodiment reference plane 22 is a substantially solid conducting sheet having apertures 23 defined therein for isolation purposes, an alternate method for constructing a reference plane on a PCA is to use a signal layer instead of an internal plane layer and form the reference conductor out of a grid of traces each connected together and all connected to the reference potential. In this case, the currents that flow in the reference grid image below the signal traces to the extent that they can. The grid can be a uniform pattern of traces or a connection of random-shaped traces. From the standpoint of this invention, it does not matter. Regardless of the pattern of the reference grid, the implementation of this invention is to remove conductors in a single or double row of apertures as stated above. If the reference plane is solid, the shape of the apertures is obvious. If the reference grid is sparse, the detailed shape of the slots may not be as evident since the "slots" may be represented by missing traces in the shape of the slots, but the results are the same. The idea is to separate the I/O circuitry currents from the rest of the PCA circuitry currents in such a way as to minimize the I/O reference plane/grid common mode potential.

The fifth layer 28 is a power plane, have multiple segmented and electrically isolated sections 30, each having different voltages. Except for these isolations, it is substantially a continuous copper sheet having multiple holes and connections similar to ground plane 22.

The bottom (sixth) layer 32, like top layer 12, contains integrated circuits (not shown) and multiple signal traces 36.

Figure 2:
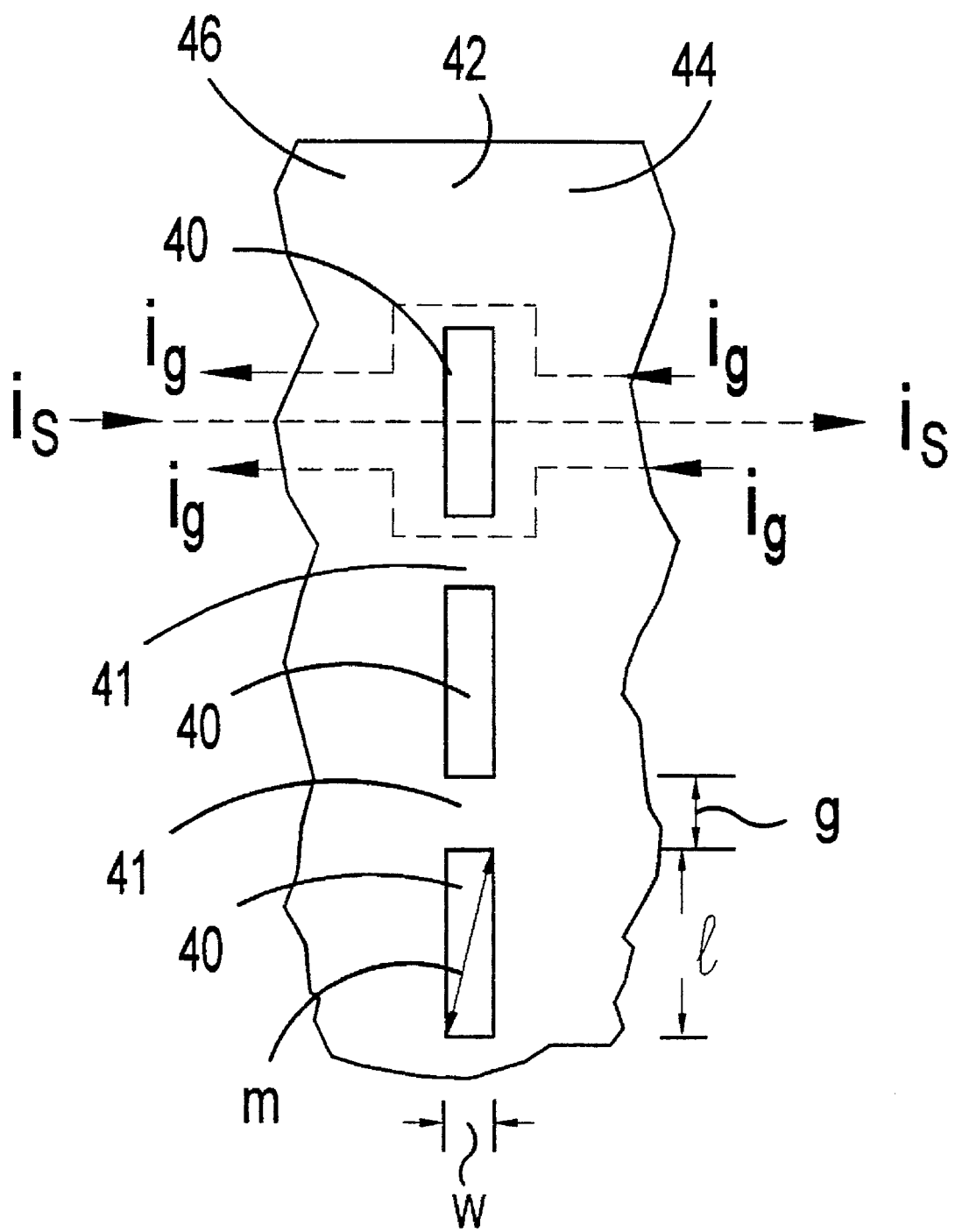
FIG. 2 is a partial plan view of a substantially single file aperture pattern in a PCA reference plane layer of the present invention.

Referring now to FIG. 2, a partial plan view is shown which illustrates an individual, substantially single file pattern of apertures (slots) 40 in ground (reference) plane 42.

The use of a single file pattern of slots in a reference plane creates, substantially, a division in the plane. The division is such that, when the reference plane is disposed in a PCA relative to an adjacent component and signal trace layer (12), the slots act to essentially "divide" the I/O communication circuitry (15) in the component layer from the rest of the integrated circuitry (14). Accordingly, it can be said that reference plane 42 is divided and isolated by slots 40 into an I/O reference plane 44 and a circuit reference plane 46.

The use of the isolated I/O reference plane is to reduce common mode cable emissions that usually emit in the frequency range between 30 and 500 MHz. By having I/O reference plane 44 on one side of ground plane 42 as divided by slots 40, and circuit reference plane 46 on the other side, it is difficult to prevent signal conductors (i.e., traces on their respective PCA layers) from crossing the slots because of routing, design, and fabrication constraints. When a signal current $i_s$ flows in a conductor (disposed in its own respective plane other than ground plane 42) and crosses slot 40 between circuit reference plane 46 and I/O reference plane 44, the return current $i_g$ (flowing in reference plane 42) is forced to flow around the divisional boundary created by the slot. As such, differential loop emissions are caused at frequencies above 300 MHz, depending on the dimensions of the boundary. The differential loop emission is a result of the forced different paths between signal trace $i_s$ and return signal $i_g$.

If the divisional boundary were a single, long, continuous slot rather than a plurality of shorter slots, the return ground current in the reference plane would be forced to loop further around the bottom of the slot creating a larger differential loop, and thus larger emissions. Accordingly, when using multiple shorter slots 40, the largest differential loop due to current $i_g$ occurs in the case where signal trace current $i_s$ is centered over slot 40 as shown in the diagram. It should be noted here that $i_g$ in its return path "images" or tries to image signal trace current $i_s$ and tends to maximize the mutual inductance and, therefore, minimize the total inductance of the signal ground loop.

This invention maintains I/O reference plane isolation while minimizing the effects of differential mode emissions by creating the plane isolation out of a series of slots 40, each with a maximum linear dimension small enough to prevent differential loop emissions in the frequency range of interest. Presently, the maximum frequency range of interest is 2 GHz, the FCC top frequency for emission control.

The maximum linear slot dimension "m" is the parameter that controls the effective differential loop emission frequency. For example, a square with sides equal to 1 unit emits the same as a circle of diameter 1.41 units. This is due to the maximum linear dimension of the square being the diagonal between two corners, or $\sqrt{2}$.

Currents $i_g$ flowing around slot 40 in ground plane conductor 42 form an emission source analogous to a dipole antenna. The emissions from this antenna increase as the slot dimensions increase toward the wavelength of the signal. In other words, it is important to maintain slot lengths that are short in comparison to the wavelength of the emission signal of interest in the dielectric of the printed circuit board. The signal of interest here is the maximum frequency specified by the FCC for this class, i.e., 2 GHz.

The formula for a wave length of a signal in a dielectric is:

$$\lambda = c/(f*0.0254 * \sqrt{\epsilon_R})$$

Where:

$\lambda$=wave length of the signal in the dielectric c=speed of light (m/s) [$3*10^8$ m/s]

f=frequency of signal [2 GHz, per FCC criteria]

$\epsilon_R$=relative permitivity of the dielectric [4.4 in this design]

0.0254=conversion from meters to inches (m/in)

In the preferred embodiment, "short in comparison to the wavelength of the signal of interest in the dielectric of the printed circuit board" was chosen to be a factor of 20. However, a factor of 4 is about the minimum for being short in comparison to the wavelength of the signal. The equation above gives a $\lambda$=2.815 inches, and $\lambda/20$ is therefore 0.140 inches. Accordingly, the printed circuit board of this embodiment is designed to have slots with a length "l" of about 0.140 or 0.150 inches.

The width "w" of slot 40, and end-to-end gap "g" are set at the minimum design criteria measurement relating to a minimum manufacturable distance for this type of device. In this case, 0.005 inches for both measurements is about the minimum manufacturable distance.

The impedance of the conductors 41 between the ends of the slots affects the isolation between the two conductive planes 44 and 46. The higher the impedance, i.e., inductive reactance $X_L$ and resistance R, between the planes, the more effective the isolation and the bigger the reduction of common mode emissions. In the case of the single row of slots, the dimension of the inter-plane connections 41 is defined by "w" and "g". Namely, the conductor is effectively "w" long and "g" wide.

For N slots in a particular reference plane design, there are approximately N inter-plane conductors 41. A short and wide conductor provides a relatively low impedance connection which degrades the isolation between the planes. A first order approximation of the inductance between the two planes is given as:

Reactance for a single row of slots: $X_L = 2\pi f L$ and Inductance: $L = \dfrac{w * l}{N}$ Where:

L=total inductance between isolated planes w=length of a conductor "g" inches wide l=inductance per unit length for a conductor "g" inches wide (nil/in)

N=number of parallel conductors.

Resistance: $R = \dfrac{w * \rho}{NA}$

Where:

R=total resistance between isolated Planes w=length of conductor "g" inches wide p=resistivity of the ground plane conductor A=cross-sectional area of the conductor.

N=number of parallel conductors.

Figure 3:
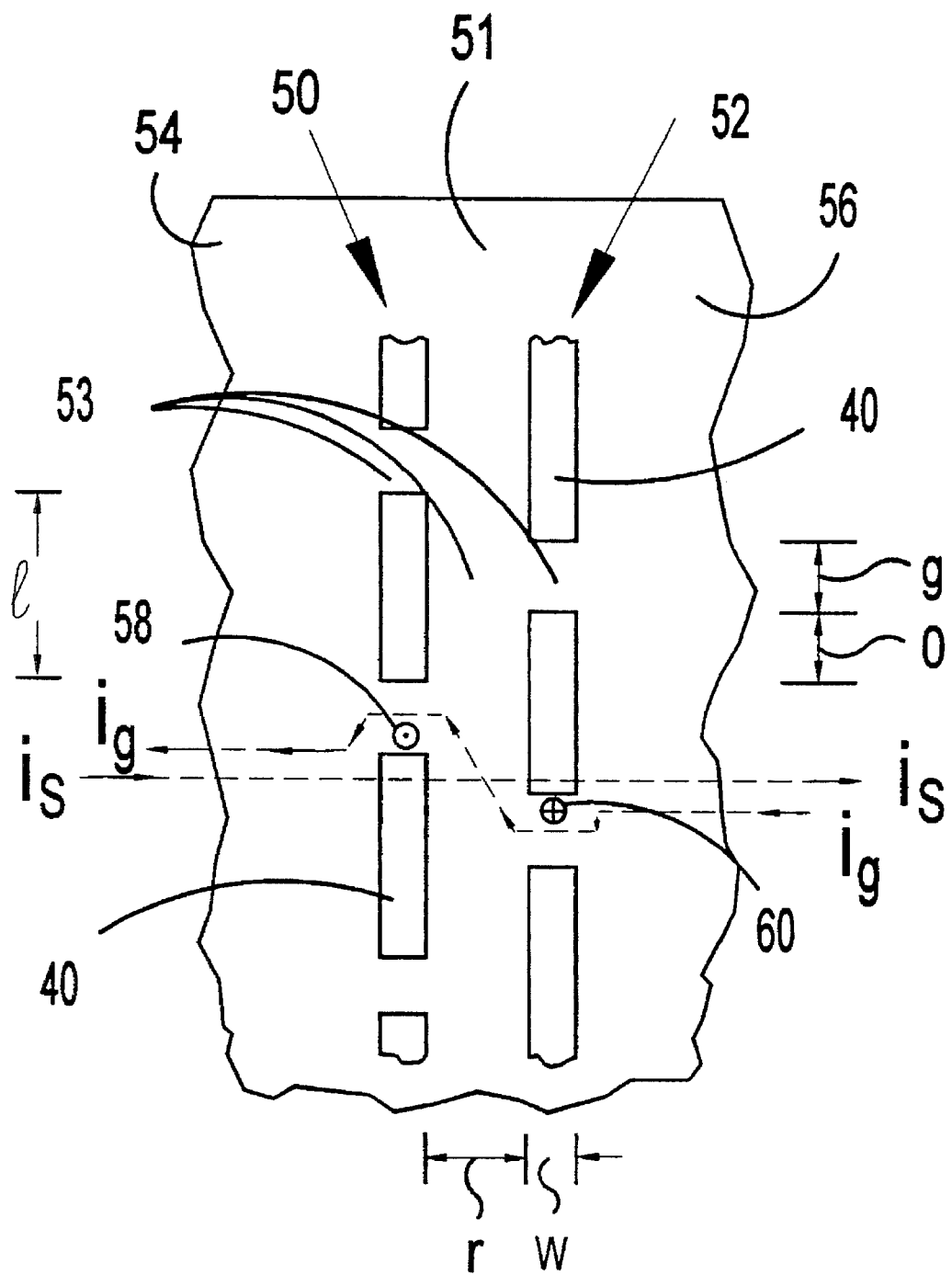
FIG. 3 is a partial plan view of the preferred embodiment having a double row of substantially single file aperture patterns in a PCA reference plane layer.

Referring now to FIG. 3, the preferred embodiment of the present invention is depicted wherein a double row of substantially single file apertures (slots) 50 and 52 are patterned in a PCA reference plane layer 51. With the addition of a second adjacent row of slots the effective length of the inter-plane connections 53 is increased to 2w+r+o, where:

"o" is the overlap (stagger effect) created by a slot in reference to a corresponding slot in the adjacent single file pattern; and, "r" is the row to row spacing, i.e., the spacing between the double row of substantially single file apertures.

Namely, each slot 40 in single file pattern 50 is offset staggered distance "o" with reference to each corresponding slot 40 in pattern 52. Similarly, each slot 40 in single file pattern 50 is spaced distance "r" from each corresponding slot 40 in pattern 52. As with "w" and "g", measurement "r" is also preferably set at the minimum design criteria measurement relating to a minimum manufacturable distance for this type of device, i.e., about 0.005 inches. On the other hand, distance "o" is preferably ½ the length "l".

In this embodiment, the number of paths from one side 56 of the double row of slots to the other 54 increases by a factor of two. Again, an approximation is given by:

Inductance: $L = \dfrac{(2w + r + o) * l}{2N}$

Where:

Row to Row Spacing (r)=0.005"

Row to Row Overlap (o)=½ * l=½ * 0.150=0.075"

Resistance: $R = \dfrac{(2w + r + o) * \rho}{2AN}$

The improvement factor for the double row of single file patterns (FIG. 3) with respect to the individual single file pattern (FIG. 2) is the ratio of the double slot equations to the single slot equations which for L reduce to:

Effective Length Increase Ratio $= \dfrac{2w + r + o}{2w}$ $= \dfrac{.010 + .005 + .075}{2 * .005}$ Ratio = 9

The ratio of resistances can also be shown to be 9. That is to say that for an increase in the number of slots in this ground plane by a factor of 2 we get an increase in the resistance and inductance by a factor of 9.

These additional apertures cut into the solid, conductive plane of the PCA reduce the effectiveness of the reference plane shielding the signals on the inner trace layers 24 and 26 by creating the potential for slot radiation. The worst case approximation for shielding loss in an individual single file pattern is given by:

$$\text{shielding loss } S = -20 \log \sqrt{N}$$

and if N increases by a factor of 2 for a double row of apertures, then:

$$S = -20 \log \sqrt{2N}$$

with a net difference being:

$$S = -20 \log \sqrt{N} - 20 \log \sqrt{2}$$

$$S = -20 \log \sqrt{N} - 3.01 \text{ dB}$$

This is for N number of slots in a shield. First one calculates the potential benefit that the shield has in preventing emissions from penetrating the shield, then subtracts the shielding loss from apertures. When the change in the number of slots is a factor of 2 (i.e., a double row perspective), the shielding loss due the additional apertures is seen to be −3 dB.

Referring again to FIG. 3, magnetic field 60, created due to ground return current $i_g$ flowing around the first row of slots 52, will destructively interfere with the magnetic field 58, created due to return current $i_g$ continuing to flow around the second row of slots 50. The net result is that the shielding loss is small, especially when the length "l" of the slot and the row-to-row spacing "r" are kept at a minimum, and as mentioned, the overlap (stagger) dimension "o" is about ½ the length "l".

This optimum overlap length "o" is determined by finding the maximum impedance between the two isolated conductors. Intuitively, the maximum resistance (and thus inductance) is found by considering the two parallel paths through any gap between the first row of slots. The conductive paths between the isolated plane converge at the conductor in the end to end gap "g". From any gap there are two paths to the other isolated plane, one path around the slot to the top and one around the slot to the bottom. These two impedance's are in parallel, and so finding the maximum parallel combination gives the maximum total impedance.

$$R1 = \frac{(2w + r + o_1) * \rho}{2A}$$

$$R2 = \frac{(2w + r + o_2) * \rho}{2A}$$

$$Rt = \frac{R1 * R2}{R1 + R2}$$

Where:
$l = o_1 + o_2$ and $o_2 = l - o_1$ $$Rt = \frac{[\rho(2w + r + o_1)][\rho(2w + r + o_2)]/2A^2}{[\rho(2w + r + o_1) + \rho(2w + r + o_2)]/2A}$$

$$Rt = \frac{\rho(4w^2 + 4wr + 2wl + r^2 + lr + lo_1 - o_1^2)}{A(4w + 2r + l)}$$

$$\frac{dRt}{do_1} = \frac{\rho(l - 2o_1)}{A(4w + 2r + l)}$$

This is maximized when the first derivative is set equal to zero. This occurs at: $1 - 2o_1 = 0$; $o_1 o_2 = l/2$ Thus, the optimum overlap between the two rows of slots is shown to be half of the length of the slot.

Figure 4:
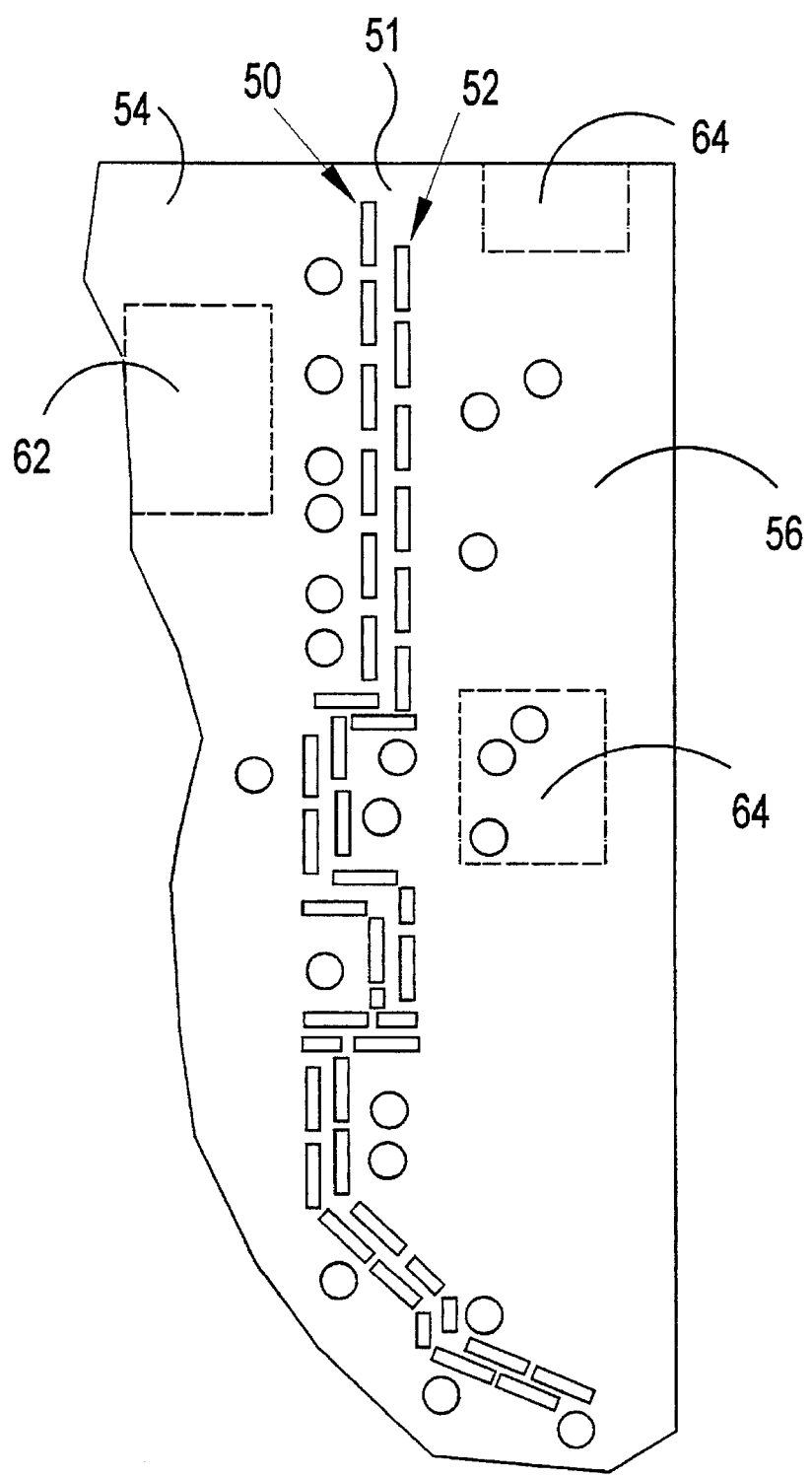
FIG. 4 is a partial plan view of a reference plane having the preferred embodiment double row of slots that substantially separate and isolate the I/O reference plane from the circuit reference plane.

Referring now to FIG. 4, the double row of slots 50 and 52 is shown substantially separating the circuit reference plane 54 from the I/O reference plane 56. The zig-zag nature of the rows is due to the placement of the IC components on a component layer of the PCA (see top layer 12 of FIG. 1). As discussed, this placement of the slots is to effectively and substantially separate the digital integrated circuitry components 62 (which actually reside on the component layer) from the I/O circuitry 64 (also on the component layer). In the case where a power plane layer (30 of FIG. 1) is being isolated as a reference plane, a functionally similar type of separation would be used depending on the location of any adjacent layer components (32 of FIG. 1).

What has been described above are the preferred embodiments for a PCA having improved reference plane isolation. It is clear that the present invention offers a powerful tool for providing a cost effective means for reducing electromagnetic emissions and specifically common mode cable emissions. While the present invention has been described by reference to specific embodiments, it will be obvious that other alternative embodiments and methods of implementation or modification may be employed without departing from the true spirit and scope of the invention.

What is claimed is:

1. A printed circuit assembly (PCA) having improved reference plane isolation for reducing electromagnetic emissions, comprising:

(a) a component layer having Input/Output (I/O) communication circuitry and non I/O circuitry thereon; and, (b) a reference plane layer having a plurality of apertures therein, wherein:

(i) the apertures are aligned in a substantially single file pattern on the reference plane; and, (ii) when the reference plane layer and component layer are disposed in the PCA, the apertures are placed relative to the component layer such that they substantially separate the non I/O circuitry from the I/O communication circuitry.

2. The PCA of claim 1 wherein the I/O communication circuitry is selected from the group consisting of receivers, transceivers, terminators, and I/O interface signal drivers.

3. The PCA of claim 1 wherein the I/O communication circuitry is coupled to a communication cable for interconnecting the PCA with external components.

4. The PCA of claim 1 wherein the reference plane is selected from the group consisting of (i) a substantially solid sheet of conducting material and (ii) a signal layer having a plurality of traces connected to a reference potential.

5. The PCA of claim 1 wherein each of the apertures is substantially slot shaped.

6. The PCA of claim 1 further including a signal trace layer having signal traces thereon, and wherein when the reference plane layer and signal trace layer are disposed in the PCA, the apertures are placed relative to the signal trace layer such that they are more perpendicular to the traces than not perpendicular.

7. The PCA of claim 6 wherein the signal trace layer and the component layer are one and the same.

8. The PCA of claim 1 wherein each aperture has a maximum linear dimension of less than about λ4, where λ equals a wavelength of a maximum emission signal frequency of concern calculated for a dielectric of the PCA.

9. The PCA of claim 1 wherein each aperture has a substantially minimum manufacturable width dimension.

10. The PCA of claim 1 wherein each aperture is disposed substantially a minimum manufacturable distance from any adjacent aperture.

11. A printed circuit assembly (PCA) having improved reference plane isolation for reducing electromagnetic emissions, comprising:
   (a) a component layer having Input/Output (I/O) communication circuitry and non I/O circuitry thereon; and,
   (b) a reference plane layer having a plurality of apertures therein, wherein:
      (i) the apertures are aligned in a plurality of substantially single file patterns, the single file patterns being positioned substantially parallel to and substantially adjacent to each other on the reference plane; and
      (ii) when the reference plane layer and component layer are disposed in the PCA, the apertures are placed relative to the component layer such that they substantially separate the non I/O circuitry from the I/O communication circuitry.

12. The PCA of claim 11 wherein each aperture is substantially slot shaped.

13. The PCA of claim 11 further including a signal trace layer having signal traces thereon, and wherein when the reference plane layer and signal trace layer are disposed in the PCA, the apertures are placed relative to the signal trace layer such that they are more perpendicular to the traces than not perpendicular.

14. The PCA of claim 13 wherein the signal trace layer and the component layer are one and the same.

15. The PCA of claim 11 wherein each aperture has a maximum linear dimension of less than about λ/4 where λ equals a wavelength of a maximum emission signal frequency of concern calculated for a dielectric of the PCA.

16. The PCA of claim 11 wherein each aperture in any of the single file patterns is disposed substantially a minimum manufacturable distance from any adjacent aperture in the same single file pattern.

17. The PCA of claim 11 wherein each single file pattern is disposed substantially a minimum manufacturable distance from any adjacent single file pattern.

18. The PCA of claim 11 wherein each of the plurality of single file patterns are staggered with respect to each adjacent single file pattern such that each aperture in one of the single file patterns is offset aligned with respect to a correlative aperture in any adjacent single file pattern.

19. The PCA of claim 18 wherein each single file pattern is offset staggered by about one-half of an aperture length.

20. A printed circuit assembly (PCA) having improved reference plane isolation for reducing electromagnetic emissions, comprising:
   (a) a component layer having Input/Output (I/O) communication circuitry and non I/O circuitry thereon; and,
   (b) a reference plane layer having a pair of substantially single file patterned apertures therein, wherein:
      (i) the single file patterns are positioned substantially parallel to and substantially adjacent to each other on the reference plane;
      (ii) the reference plane layer and component layer are disposed in the PCA such that the apertures are placed relative to the component layer so as to substantially separate the non I/O circuitry from the I/O communication circuitry;
      (iii) each aperture is substantially slot shaped;
      (iv) the apertures are placed relative to signal traces such that they are substantially perpendicular;
      (v) each aperture has a maximum linear dimension of less than about λ/4 where λ equals a wavelength of a maximum emission signal frequency of concern calculated for a dielectric of the PCA;
      (vi) each aperture in any of the single file patterns is disposed substantially a minimum manufacturable distance from any adjacent aperture in the same single file pattern;
      (vii) each single file pattern is disposed substantially a minimum manufacturable distance from any adjacent single file pattern; and
      (viii) each of the single file patterns is staggered with respect to each adjacent single file pattern such that each aperture in one of the single file patterns is offset aligned with respect to a correlative aperture in the adjacent single file pattern by about one-half of a slot length.

* * * * *